United States Patent [19]

Shimizu et al.

[11] Patent Number: 4,731,792

[45] Date of Patent: Mar. 15, 1988

[54] SEMICONDUCTOR LASER DEVICE WITH DECREASED LIGHT INTENSITY NOISE

[75] Inventors: Hirokazu Shimizu, Suita; Masahiro Kume; Masuru Wada, both of Takatsuki; Kunio Itoh, Uji; Ken Hamada, Toyonaka; Fumiko Tajiri, Takatsuki, all of Japan

[73] Assignee: Matsushita Electric Industrial Co., Ltd., Kadoma, Japan

[21] Appl. No.: 948,393

[22] Filed: Dec. 30, 1986

Related U.S. Application Data

[63] Continuation of Ser. No. 623,562, Jun. 22, 1984, abandoned.

[30] Foreign Application Priority Data

Jun. 29, 1983 [JP] Japan ................................. 58-117650
Jun. 29, 1983 [JP] Japan ................................. 58-117651

[51] Int. Cl.[4] .............................................. H01S 3/19
[52] U.S. Cl. ......................................... 372/49; 372/48
[58] Field of Search ............................... 372/49, 48, 44

[56] References Cited

U.S. PATENT DOCUMENTS 4,092,659  5/1978  Ettenberg ............................ 372/49
4,280,107  7/1981  Scifres et al. ....................... 372/99

FOREIGN PATENT DOCUMENTS 0026062  4/1981  European Pat. Off. ............. 372/48

Primary Examiner—James W. Davie
Attorney, Agent, or Firm—Cushman, Darby & Cushman

[57] ABSTRACT

In a TRS (twin ridge substrate) type semiconductor laser, reflectivity at both facets of the resonator at the oscillation wavelength is selected to be higher than the reflectivity of the semiconductor crystal of the laser device, but smaller than 1, thereby stabilizing the light oscillation with a low S/N ratio.

7 Claims, 12 Drawing Figures

SEMICONDUCTOR LASER DEVICE WITH DECREASED LIGHT INTENSITY NOISE

This is a continuation of application Ser. No. 623,562 filed June 22, 1984 abandoned.

BACKGROUND OF THE INVENTION

1. Field of the Invention

The present invention relates generally to semiconductor laser devices, and particularly to a semiconductor laser device suitable for use in optical information processing.

2. Description of the Prior Art

Semiconductor laser devices have many features such as small size and high efficiency, capability of direct modulation by driving current, and the like, and they have been widely utilized as light sources for optical communication or optical information processing in recent years. In order to be utilized for these purposes, little fluctuation of light output, i.e., little light intensity noise is necessary. What is especially important is smallness of the light intensity noise in case the outputted light is reflected and returned at the coupling with the optical system.

A conventional semiconductor laser, for instance, a semiconductor laser as shown in FIG. 1, comprises a substrate 1 of GaAs crystal on which a channel 11 is formed, and includes n—$Ga_{1-y}Al_yAs$ (y≃0.4) as a clad layer 2,
n—$Ga_{1-x}Al_xAs$ (x≃0-0.2) as an active layer 3, and
p—$Ga_{1-y}Al_yAs$ (y≃0.4) as a clad layer 4.

As facets of a resonator, cleaved faces of the crystal chip are utilized, and a cleaved face is used without a cover or is covered with dielectric layers of $SiO_2$ or $Al_2O_3$ with a thickness of $\lambda/2n$, where n is the refractive index and $\lambda$ is the wavelength of oscillation of the laser. Incidentally, the conventional laser shown in FIG. 1 further comprises an overriding layer of n—GaAs, a Zn diffused region 51, a positive side electrode 6 of Ti/Pt/Au and a negative side electrode 7 of Au—Ge—Ni.

The current vs. light output characteristic and the current vs. noise characteristic of the conventional semiconductor laser is as shown in FIG. 2. Also, the temperature dependency of the S/N ratio for the case where 0.1–5% of the light output returns by reflection is shown in FIG. 3. As is shown in these graphs, noise frequencies of 2–12 MHz are measured with a bandwidth of 300 KHz. Such noise characteristics are harmful for actual use, especially for use as a light source for an optical type video disk player, thereby disabling actual usage.

SUMMARY OF THE INVENTION

The purpose of the present invention is to provide a semiconductor laser device which is capable of oscillation at a low noise level even when fed-back light is caused by reflection of its own output light.

A semiconductor laser device in accordance with the present invention comprises a resonator having a light reflectivity at both facets for the oscillation wavelength higher than the reflectivity of the surfaces of the semiconductor crystal material.

DESCRIPTION OF THE PREFERRED EMBODIMENTS

Figure 4:
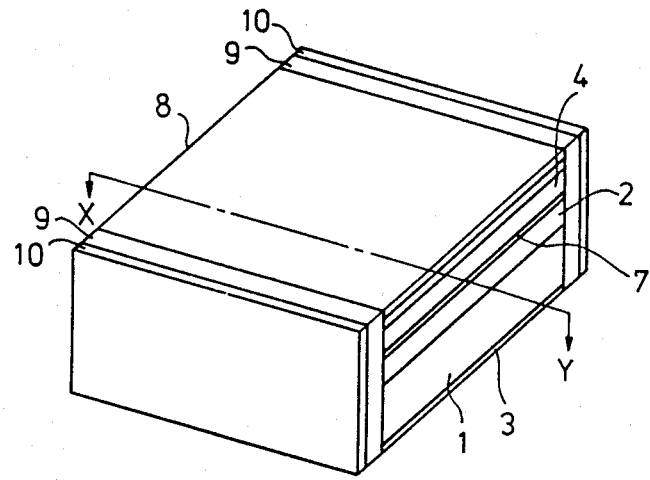
FIG. 4 is a perspective view of a semiconductor laser device of a first embodiment in accordance with the present invention.
Figure 5:
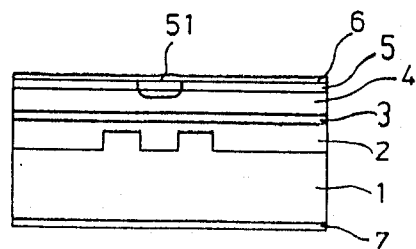
FIG. 5 is a sectional elevation view of the device of FIG. 4 at the X-Y sectional plane.

Hereafter, the preferred embodiments in accordance with the present invention are described with reference to the drawings of FIG. 4 and thereafter, wherein FIG. 4 is a perspective view of a first embodiment in accordance with the present invention and FIG. 5 is a cross sectional view along the X-Y plane of FIG. 4.

FIG. 4 shows a chip 8 of a twin ridge substrate (TRS) type semiconductor laser, which has been proposed by some of the inventors and has a cross-sectional configuration as shown in FIG. 5, a cross-sectional view at the X-Y plane being parallel to a facet of the resonator. The chip has an $Si_3N_4$ film of a thickness of $\lambda/4n_1$ wherein $\lambda$ is the oscillation wavelength of the laser and $n_1$ is the refraction index of the $Si_3N_4$ film. The facets of the chip further have films of amorphous Si (hereafter referred to as a—Si) of thickness of $\lambda/4n_2$ or above, wherein $n_2$ is refractivity of a—Si at the wavelength $\lambda$.

Operation of the semiconductor laser device having the above-mentioned configuration will now be described. The above-mentioned TRS type semiconductor laser has light absorption at two ridges provided on the substrate 1, thereby stabilizing the transverse oscillation mode of the laser to realize fundamental transverse mode oscillation. The $Si_3N_4/a$—Si film functions to improve light reflection by means of repeated reflection and interference, and in this embodiment, the reflectivity becomes 0.7–0.8 (i.e., 70–80%) as a result of utilization of a laser having an oscillation wavelength of 7800 Å.

Figure 6:
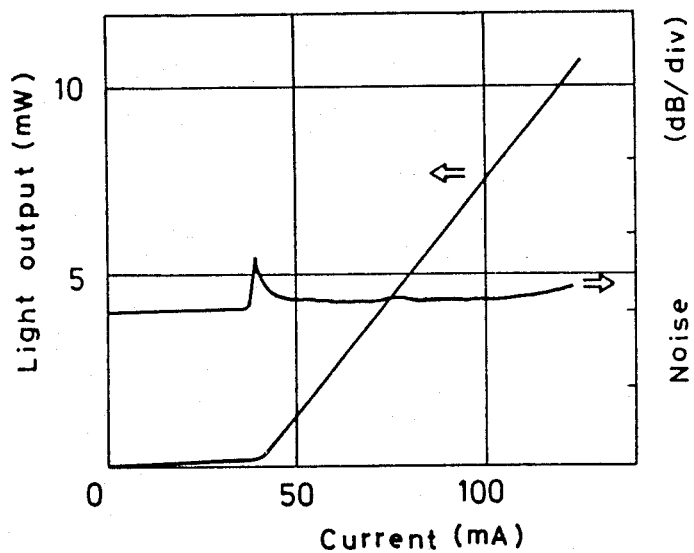
FIG. 6 is a graph showing the current vs. light output characteristic and the current-noise characteristic of the semiconductor laser of the first embodiment of FIG. 5.
Figure 7:
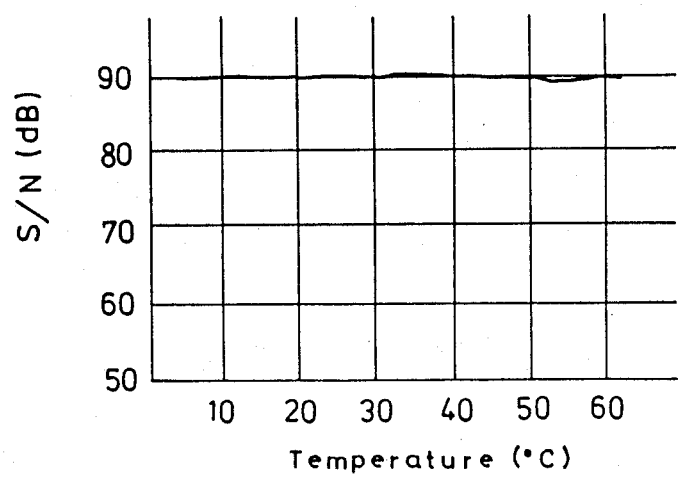
FIG. 7 is a graph of temperature dependence of the S/N ratio of the semiconductor laser device of FIG. 5.

FIG. 6 shows the current vs. light output characteristic and the current vs. noise characteristic of the semiconductor laser of this embodiment. FIG. 7 shows the temperature dependence of the light output signal vs. S/N ratio, when light output from a facet of the semiconductor laser is 3 mW. A negative feedback is carried out by detecting light output from the other facet as a signal proportional to the aforementioned light output, to thereby control operation current to stabilize the light output.

The above-mentioned light output control is carried out to enable taking out light output from both facets of the resonator by decreasing reflectivity of light at the facets to be smaller than 1.0.

Since the reflectivity at facets of the resonator of the semiconductor laser device at its oscillation wavelength is selected to be sufficiently higher than a reflectivity of about 0.3 at a cleaved face of the semiconductor crystal of the laser, the rate of feedback of oscillated light reflected by external object into an internal space of the resonator decreases since the reflectivity at the resonator facets is sufficiently high. Accordingly, light energy accumulated in the internal space increases, and thereby, the effect of light incident from the outside decreases so as to cause stable oscillation. Furthermore, by selecting the reflectivity at both facets to be smaller than 1, such sufficient light output as is usable from both facets is obtainable.

Accordingly, light output from one facet can be utilized as monitoring output that is proportional to the output from the other facet. By detecting the intensity of the light output from one facet and by carrying out a negative feedback with this detected signal, stabilization of light output from the other facet is achievable. As a result of the above-mentioned devices, as can be observed from the experimental results in the graphs, the semiconductor laser device in accordance with the present invention can achieve 10-30 db noise reduction in comparison with the conventional semiconductor laser.

Figure 8:
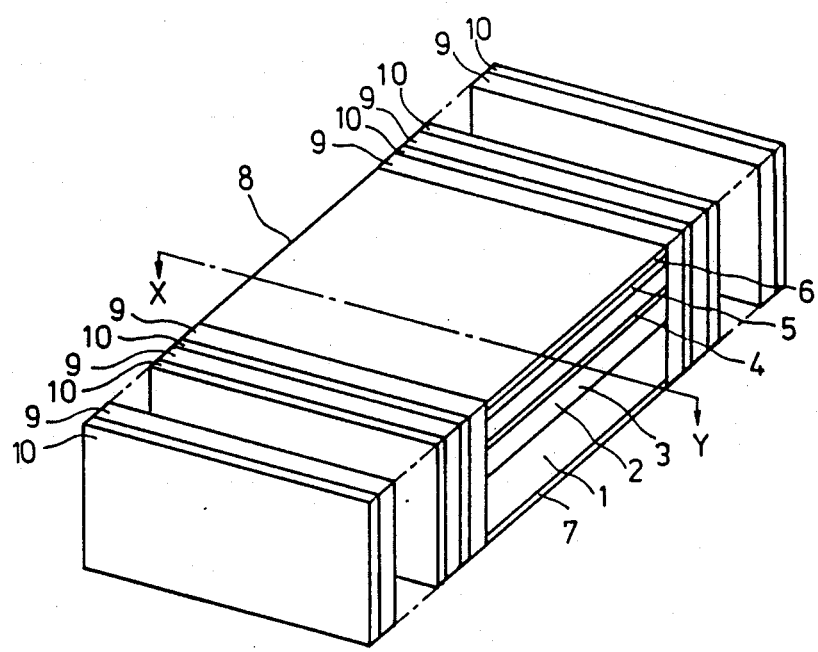
FIG. 8 is a perspective view of a semiconductor laser device of a second embodiment in accordance with the present invention.

A second embodiment in accordance with the present invention is described with reference to FIG. 8 and thereafter. FIG. 8 is a perspective view showing a configuration of the semiconductor laser device of the second embodiment. The laser shown in FIG. 8 has the TRS type (twin ridge substrate type) semiconductor laser chip, on both facets of which $Al_2O_3$ film 9 and an Si film are provided. Also at least one set of the double layered $Al_2O_3$ film and Si film are laminated on both facets of the resonator. The TRS type semiconductor laser chip has the same cross sectional configuration as shown in FIG. 5.

Operation of the semiconductor laser device configurated as shown in FIG. 8 is described hereafter. As is known, the TRS type laser realizes a stable fundamental transverse mode oscillation by controlling the oscillated transverse mode using utilizing light absorption by two ridges provided on a GaAs substrate 1. The reflectivity at facets are increased of repeated reflection interference by the double layers, and by selecting the thickness of each layer of the double layer and the number of detection (lamination) of the double layers formed on the facets, the reflectivity can be selected at an arbitrary value in the range of 0.45 and to 0.8.

Figure 9:
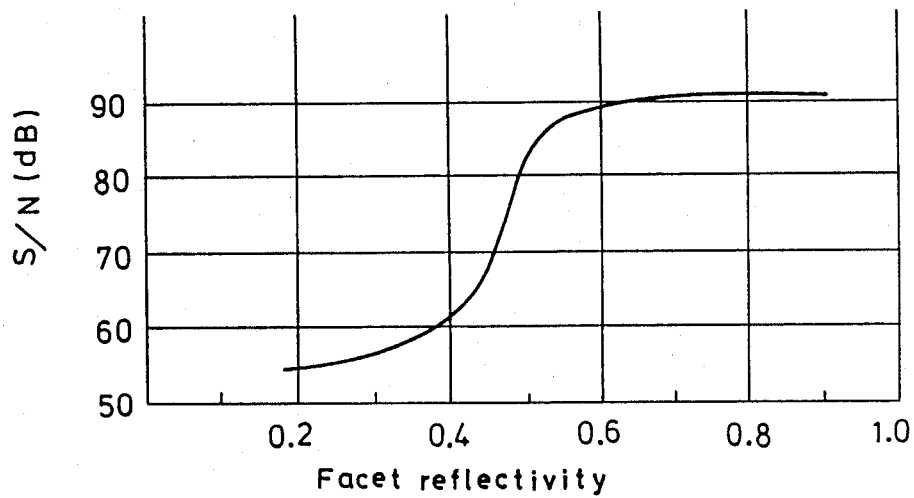
FIG. 9 is a graph of the temperature dependence of the S/N ratio of the semiconductor laser device of FIG. 8.

FIG. 9 is a graph showing experimental results of the S/N ratio of light output based on facet reflectivity. The S/N ratios are measured for frequencies of 2-12 MHz with a bandwidth of 300 kHz. The measurement is made by using 3 mW light output, and with a light feedback rate of 0-1%, minimum S/N ratios during each variation are measured. The graph shows that the S/N ratio can be drastically improved by selecting the facet reflectivity to be above 0.45. The higher the facet reflectivity is, the higher the S/N ratio becomes. When the facet reflectivity is high, however, the external differential quantum efficiency decreases, thereby disabling taking out of practically utilizable light output.

Figure 10:
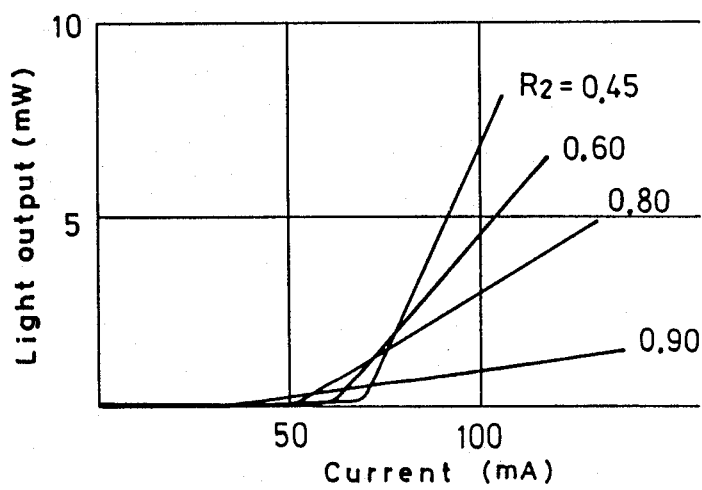
FIG. 10 is a graph showing the current vs. light output characteristic of the same semiconductor laser device with reflectivity of one facet being varied.

FIG. 10 is a graph showing a current versus light output characteristic measured under a condition that reflectivity $R_1$ of one facet is 0.80 and a reflectivity $R_2$ of the other facet is varied from 0.45, 0.6, 0.8 and 0.9. From the graph, it is observed that for $R_2$ of 0.8 or higher, taking out of practically utilizable light output is not achievable, and accordingly, the facet reflectivity must be selected to be 0.8 or lower.

Figure 11:
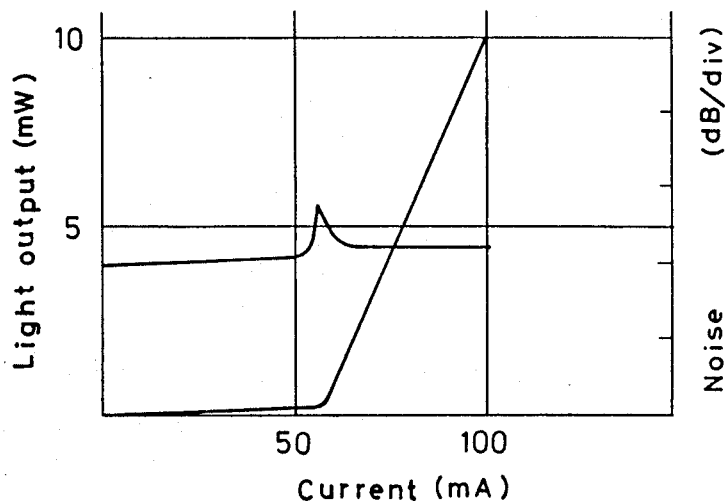
FIG. 11 is a graph showing the current vs. light output characteristic and current vs. noise characteristic of the semiconductor laser of the second embodiment of FIG. 8.

FIG. 11 shows the current vs. light output characteristic and the current vs. noise characteristic of the semiconductor laser of this embodiment, where reflectivity at one facet is selected to be 0.75 and that of the other facet is selected to be 0.7, and the light output from the latter facet is measured.

Figure 1:
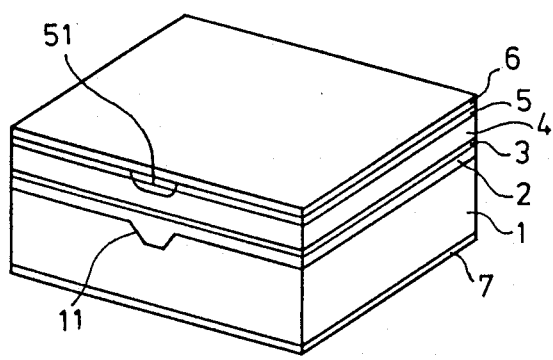
FIG. 1 is a perspective view of the conventional semiconductor laser.
Figure 2:
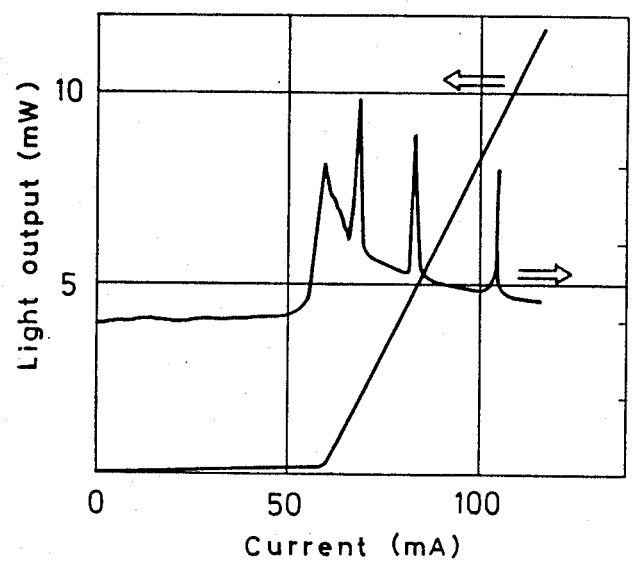
FIG. 2 is a graph showing a current vs. light output characteristic and a current vs. noise characteristic of the conventional semiconductor laser.
Figure 3:
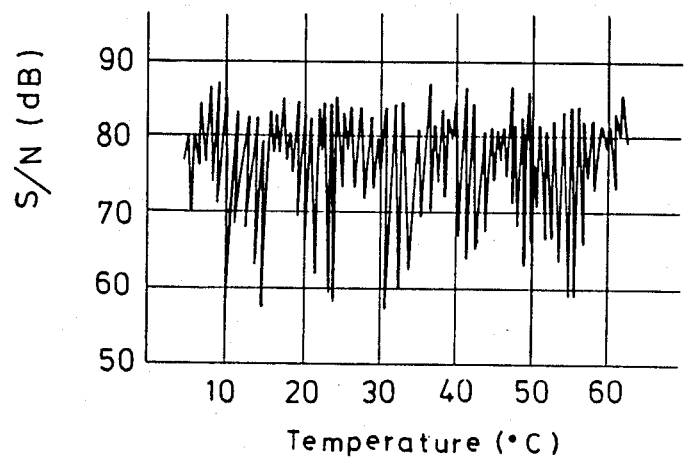
FIG. 3 is a graph of temperature dependence of the S/N ratio of the conventional semiconductor laser.
Figure 12:
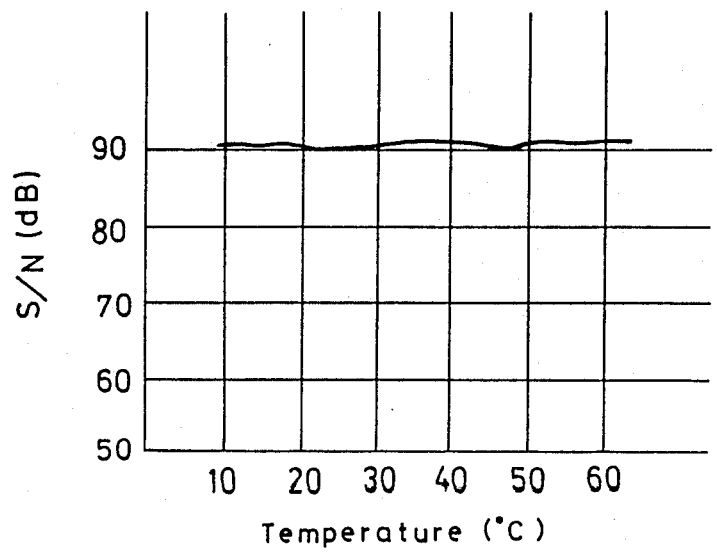
FIG. 12 is a graph of temperature dependence of the S-N ratio of the semiconductor laser device of FIG. 8.

FIG. 12 shows the temperature dependency of the light output signal vs. S/N ratio when light output from a facet of the semiconductor laser is 3 mW. A negative feedback is carried out by detecting light output from the other facet as a signal proportional to the aforementioned light output so as to control operation current to stabilize the light output. The rate of the negative feedback is changed in a range of 0-1% and as shown in FIG. 12, the temperature dependence of the S/N ratio is much improved in comparison with the conventional semiconductor laser of FIG. 3.

What is claimed is:

1. In a semiconductor laser device, the improvement comprising:
   a resonator having light reflectivities of first and second predetermined values at each of two facets in a range of 0.45 to 0.8 for the oscillation wavelength.

2. An improvement in a semiconductor laser device in accordance with claim 1, wherein each of said facets of the resonator comprises at least one double layer of two substances having different refractive indexes.

3. In a semiconductor laser device, the improvement comprising:
   a resonator having light reflectivities of first and second predetermined values at each of two facets in a range of 0.45 to 0.8 for the oscillation wavelength, said facets being clad with a multi-layered coating having alternate repeated lamination of layers of two substances having different refractive indexes.

4. In a semiconductor laser device, the improvement comprising:
   a semiconductor substrate on a principal face thereof two parallel ridges defining a stripe-shaped recess as a resonance cavity between said two parallel ridges;
   plural semiconductor layers including an active layer formed on said principal face; and
   two facets for said cavity which are formed vertical to said plural semiconductor layer, each facet having a predetermined reflectivity in a range of 0.45 to 0.8.

5. An improvement in a semiconductor laser device in accordance with claim 4, further comprising means for detecting light output from each facet and feeding the light output back as a signal proportional to the output of the other facet so as to control operation current to stabilize light output.

6. A semiconductor laser device comprising:

a semiconductor substrate having two parallel ridges on a principal face thereof defining a stripe-shaped recess as a resonance cavity between said two parallel ridges;

plural semiconductor layers including an active layer formed on said principal face;

two facets for said cavity which are formed vertical to said plural semiconductor layers, each facet having a predetermined reflectivity in a range of 0.45 to 0.8;

coatings having alternate repeated lamination of layers of two substances having different refractive indexes formed on said facets for increasing reflectivity at said facets.

7. In a semiconductor laser device, the improvement comprising:

a resonator having light reflectivities of first and second predetermined values at each of two facets in a range of 0.45 to 0.8 for the oscillation wavelength; and means for detecting light output from each facet and feeding the light output back as a signal proportional to the output of the other facet so as to control operation current to stabilize light output.

* * * * *

UNITED STATES PATENT AND TRADEMARK OFFICE
CERTIFICATE OF CORRECTION

PATENT NO. : 4,731,792

DATED : March 15, 1988

INVENTOR(S) : Hirokazu SHIMIZU, Masaru WADA, Junio ITOH, Ken HAMADA and Fumiko TAJIRI It is certified that error appears in the above-identified patent and that said Letters Patent is hereby corrected as shown below: On the Title Page:

In the Heading:

[75] Inventors: the third listed inventor's name should read

-- Masaru Wada --

Signed and Sealed this

Twenty-seventh Day of December, 1988

*Attest:*

DONALD J. QUIGG

*Attesting Officer*  *Commissioner of Patents and Trademarks*